(12) United States Patent
Britch

(10) Patent No.: US 8,108,191 B1
(45) Date of Patent: Jan. 31, 2012

(54) ELECTRIC MOTOR SIMULATOR AND METHOD FOR TESTING MOTOR DRIVER DEVICES

(75) Inventor: Peter F. Britch, Miller Place, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 1122 days.

(21) Appl. No.: 11/559,061

(22) Filed: Nov. 13, 2006

Related U.S. Application Data

(60) Provisional application No. 60/748,544, filed on Dec. 8, 2005.

(51) Int. Cl.
- G06F 7/60 (2006.01)
- G06F 17/50 (2006.01)
- G06F 9/455 (2006.01)
- G06G 7/48 (2006.01)
- G06G 7/54 (2006.01)

(52) U.S. Cl. .......... 703/13; 318/139; 318/490; 318/560; 324/76.11; 324/511; 388/805; 388/812; 388/813; 703/2; 703/4; 703/6; 703/7; 703/14; 703/18; 703/23

(58) Field of Classification Search .............. 703/13, 703/2, 3, 4, 6, 7, 14, 18, 23; 318/139, 490, 318/560; 324/76.11, 511; 388/805, 812, 388/813

See application file for complete search history.

(56) References Cited

U.S. PATENT DOCUMENTS

| | | | | |
|---|---|---|---|---|
| 4,751,443 A | * | 6/1988 | Jackson et al. | 318/580 |
| 4,922,400 A | * | 5/1990 | Cook | 363/37 |
| 4,996,477 A | * | 2/1991 | Keeler et al. | 324/765.01 |
| 5,270,961 A | * | 12/1993 | Bajat et al. | 708/3 |
| 5,355,062 A | * | 10/1994 | Takizawa et al. | 318/568.1 |
| 5,513,058 A | * | 4/1996 | Hollenbeck | 361/36 |
| 5,524,498 A | * | 6/1996 | Thompson et al. | 73/865.9 |
| 5,656,897 A | * | 8/1997 | Carobolante et al. | 318/400.36 |
| 5,859,515 A | * | 1/1999 | Takizawa et al. | 318/560 |
| 5,936,371 A | * | 8/1999 | Bolash et al. | 318/685 |
| 6,079,258 A | * | 6/2000 | List et al. | 73/118.01 |
| 6,242,873 B1 | * | 6/2001 | Drozdz et al. | 318/139 |
| 6,690,174 B2 | * | 2/2004 | Sigwart et al. | 324/511 |
| 6,891,737 B1 | * | 5/2005 | Matsubara et al. | 363/95 |
| 6,892,170 B1 | * | 5/2005 | Du et al. | 703/13 |
| 2002/0088271 A1 | * | 7/2002 | Sigwart et al. | 73/118.1 |

(Continued)

OTHER PUBLICATIONS

Paramasivam et al. "Real Time Hybrid Controller Implementation for Switched Reluctance Motor Drive", American Journal of Applied Sciences 1 (4): 284-294, 2004.*

(Continued)

*Primary Examiner* — Kamini S Shah
*Assistant Examiner* — Shambhavi Patel
(74) *Attorney, Agent, or Firm* — Brian Roffe

(57) ABSTRACT

Apparatus to exercise electrical motor drivers by electrically simulating a geared electric or electrical motor by providing an electronic load for the power signals that are applied to it. Current levels in the load are monitored in real-time using gate array logic and digital signal processing (DSP) algorithms to determine torque, acceleration, velocity and/or position data of the motor and gear train. Motor and gear train positional signals are generated and fed back to the motor driver device to close the servo loop. Control algorithms within the gate array and DSP accurately simulate the motor inertia and act to simulate a physical motor under varying load conditions. A control interface modifies critical motor parameters such as inertia, losses, gear ratio, and loading.

20 Claims, 9 Drawing Sheets

U.S. PATENT DOCUMENTS

| | | | |
|---|---|---|---|
| 2004/0173036 A1* | 9/2004 | Anderson et al. | 73/866.4 |
| 2005/0284245 A1* | 12/2005 | Chen et al. | 74/388 PS |
| 2006/0038530 A1* | 2/2006 | Holling | 318/807 |

OTHER PUBLICATIONS

Husain, Iqbal "Switched Reluctance Motor Drives: Basic and Research Trends", Jul. 2003.*

Signalogic "A16D16 Multichannel ADC/DAC Module", Jul. 2000.*

Altera "FPGAs Provide Reconfigurable DSP Solutions", White Paper, Aug. 2002.*

Wiberg, Johan. "Controlling a Brushless DC Motor in a Shift by Wire System", Dec. 2003.*

Butler et al. "A Matlab-Based Modeling and Simulation Package for Electric and Hybrid Electric Vehicle Design", IEEE Transactions on Vehicular Technology, vol. 48, No. 6, Nov. 1999.*

Chowdhury et al. "Development of Induction Motors with Real-Time PWM Control and Dynamic Modeling of Drive Performance with Graphical User Interface", 1994.*

Reyneri et al. "A Hardware/Software Co-Design Flow and IP Library Based of Simulink", 2001.*

French et al. "Simulink Real Time Controller Implementation in a DSP based Motor Drive System", 2004.*

Gafvert et al. "Control of GDI engines using torque feedback exemplified by simulations", Control Engineering Practice 12 (2004) 165-180.*

Gerhardt et al. "A New Approach to Functional and Software Structure for Engine Management Systems—BOSCH ME7", 1998.*

Kapun et al. "DC Motor Library and Demonstration Examples User's Guide", 2005.*

Keyhani et al. "An Integrated Virtual Learning System for the Development of Motor Drive Systems", IEEE Transactions on Power Systems, vol. 17, No. 1, Feb. 2002.*

Lachman et al. "Dynamic Modelling of a 3-Phase 6:4 Switched Reluctance Motors Using Fuzzy Logic Technique", 2001.*

Rahman et al. "Dynamic Modeling of a Four-Phase 8/6 Switched Reluctance Motor Using CUrrent and Torque Look-Up Tables", Jul. 2001.*

* cited by examiner

ELECTRIC MOTOR SIMULATOR AND METHOD FOR TESTING MOTOR DRIVER DEVICES

CROSS-REFERENCE TO RELATED APPLICATION

This application claims priority under 35 U.S.C. §119(e) of U.S. provisional patent application Ser. No. 60/748,544 filed Dec. 8, 2005, incorporated by reference herein.

FIELD OF THE INVENTION

The present invention relates generally to an electronic apparatus capable of simulating a motor or motor-driven system and more particularly to an electronic apparatus capable of simulating a motor-driven mechanical system which rotates an antenna mass.

The present invention also relates to an electronic apparatus for interpreting motor drive signals and generating motor rotor and gear-train shaft information in real time to provide a simulation of multi-phase electric motors so that motor driver devices may be tested without requiring the presence of the multi-phase electric motors.

BACKGROUND OF THE INVENTION

Motor driver devices are traditionally tested by driving an electric motor under varying load conditions. The electric motor has many built in factors such as inertia, torque-to-drive current ratios and gear-train ratios that may not be changed. In addition, a loaded motor driver for multi-horsepower motor systems requires a large stationary motor load assembly.

It is, however, inconvenient to have each and every electric motor being tested physically present for testing the motor driver devices. Often, motors are large and heavy, and difficult to readily and easily transport from the site at which they are being used and the testing site.

It would therefore be desirable to be able to simulate an electric motor for testing purposes so that the electric motor does not have to be present for testing purposes and moreover, does not have to be transported to a particular testing site. Rather, the electric motor can be kept at the site at which it is being used and simulated at the testing site.

OBJECTS AND SUMMARY OF THE INVENTION

It is an object of one or more embodiments of the present invention to provide a new electronic apparatus capable of simulating one or more motors or motor-driven systems to thereby avoid the need to have each motor physically present for testing its driver devices.

It is another object of one or more embodiments of the present invention to provide a new electronic apparatus capable of simulating a motor-driven mechanical system which rotates an antenna mass.

It is still another object of one or more embodiments of the present invention to provide a new electronic apparatus for interpreting motor drive signals and generating motor rotor and gear-train shaft information in real-time to provide a simulation of multi-phase electric motors so that motor driver devices may be tested without requiring the presence of the multi-phase electric motors.

It is yet another object of one or more embodiments of the present invention to provide a new electronic apparatus capable of simulating motors which enables motor characteristics to be tailored by modifying the values of motor parameters to satisfy a feedback control algorithm.

Another object of one or more embodiments of the present invention is to provide a new electronic apparatus capable of simulating motors which is considerably smaller than a typical motor load assembly.

Yet another object of one or more embodiments of the present invention is to provide a new electronic apparatus capable of simulating motors which enables very large motor systems to be tested by properly sizing driver resistive and inductive load.

In order to achieve one or more of these objects and others, a first embodiment of an electronic apparatus which simulates an electric or electrical motor for testing electrical motor driver devices in accordance with the invention comprises a digital signal processing unit which is configured to simulate the electronic and electro-mechanical environment necessary for testing motor driver systems and includes an analog-to-digital acquisition system with a fixed point, digital signal processing microcomputer and analog signal synthesis using digital-to-analog converters (ADCs). The digital signal processing unit includes a field programmable gate array (FPGA), or other comparable hardware component, to aid the signal processing in hardware. With this topology, one or more of the objects of the invention are realized including, for example, benefits of repeatability and accuracy through mathematical algorithms (no sensitivity to analog processing) and the fact that the passive motor loads (resistor/inductor) are closely matched to the actual motor electrically.

One embodiment of a method for simulating, in real-time, an electro-mechanical motor system for testing a motor driver for the motor system in accordance with the invention entails coupling a load fixture to the motor driver to be controlled thereby, coupling at least one current detector to the load fixture, each current detector being arranged to detect current of a respective drive phase of the motor driver, configuring a digital signal processing unit to simulate the motor system, and directing current readings from the current detector(s) to the digital signal processing unit which generate motor characteristic signals indicative of characteristics of the motor system in the presence of the same current readings.

Configuration of the digital signal processing unit to simulate the motor system can be implemented as a simulation of the electronic and electro-mechanical environment necessary for testing motor driver systems and includes, for example, an analog-to-digital acquisition system with a fixed point digital signal processing microcomputer and analog signal synthesis using digital-to-analog converters (DACs). An implementation of this configuration is described above.

The digital signal processing unit can be selectively configured to simulate different motor systems. This can be achieved by adjusting motor parameters such as inertia, losses, loading and gear-train ratios.

The motor characteristic signals may be directed as feedback signals to a processor which controls the motor driver to ascertain the functionality of the motor driver. Also, the motor driver can be adjusted based on the feedback signals.

Functionality of the digital signal processing unit is preferably enabled by converting the current readings from each current detector into digital form for processing by the field programmable gate array in the digital signal processing unit, or other comparable hardware component or components, and representing the simulated motor system by mathematical algorithms embedded in the digital signal processing unit. The algorithms are preferably designed to derive angular velocity and position of an antenna mass upon excitation by the motor drivers based on input of the detected current readings and stored motor rotational position, as well as possibly other parameters relating to the motor system.

Other and further objects, advantages and features of the present invention will be understood by reference to the following specification in conjunction with the annexed drawings, wherein like parts have been given like numbers.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
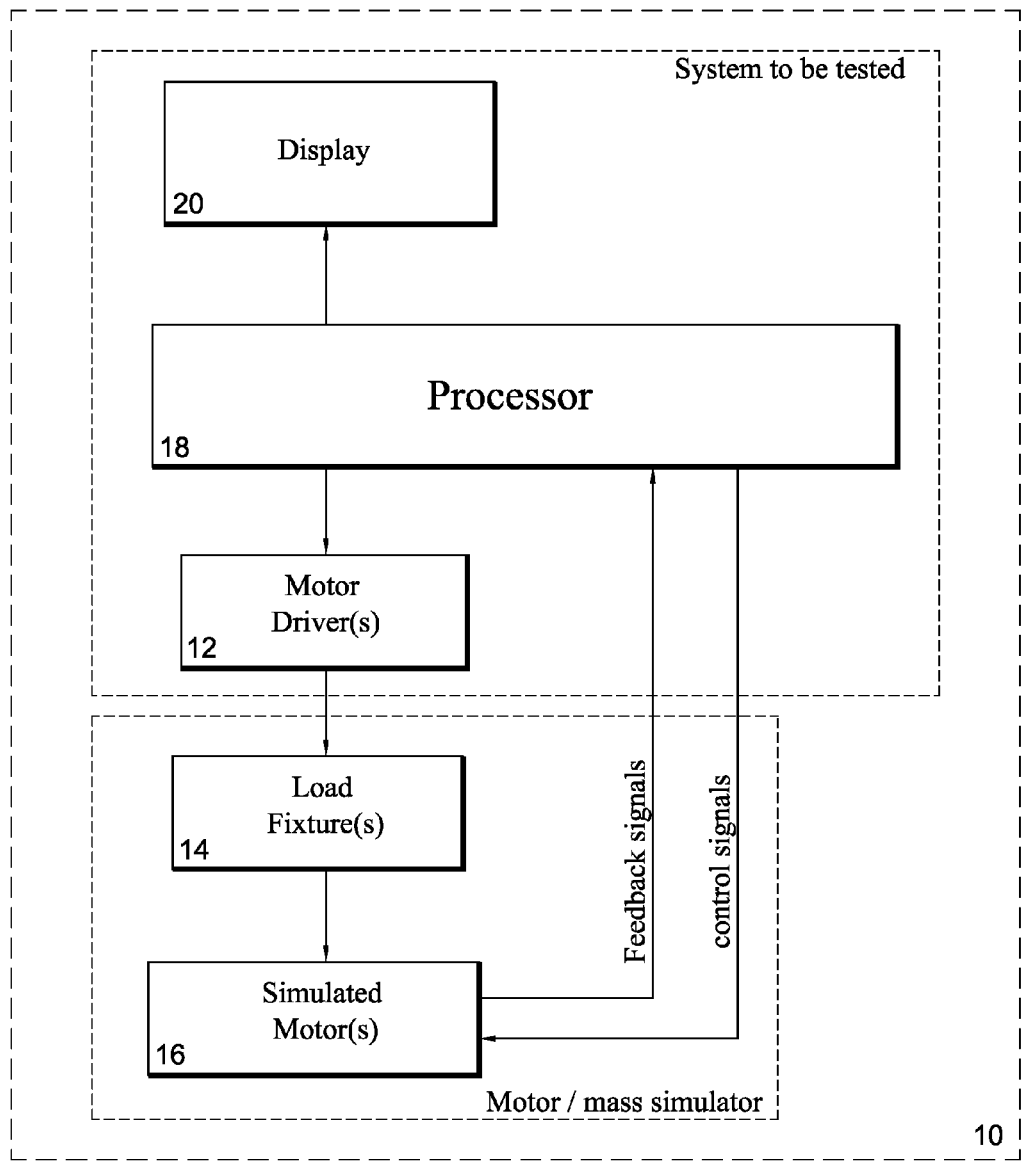
FIG. 1 is a block diagram showing an exemplifying system in accordance with the invention.

Referring to the accompanying drawings wherein like reference numerals refer to the same or similar elements, FIG. 1 shows a general outline of an exemplifying system in accordance with the invention for testing a driver device for a motor, and specifically an electric or electrical motor. The system is designated generally as 10 and comprises a motor driver device 12 under test, one or more load fixtures 14, a simulated motor system 16 on which the driver device 12 is operative, a processing module, unit or system referred to simply as a processor 18 which controls the driver device 12 and the simulated motor system 16 and a display 20 on which information about the testing of the driver device 12 is displayed. System 10 can be segmented into two components, one is the system to be tested which includes the driver device 12, processor 18 and display 20, and the other is the motor/mass simulator which includes the load fixture(s) 14 and the simulated motor system 16 (these components being indicated in FIG. 1 by the two smaller rectangular sets of dotted lines).

In operation, processor 18 tests the driver device 12 by directing the driver device 12 to perform certain functions on the simulated motor system 16 and then receives data from the simulated motor system 16, e.g., in the form of signals, as to the extent to which the functions have been performed. This feedback, indicated by an arrow in FIG. 1 with the notation "feedback signals", is continuously used to test the driver device 12 to ascertain its functionality. Display 20 may be controlled by the processor 18 to show information about or based on the feedback and the functionality of the driver device 12. Typically, the processor 18 would have a set number of routines to execute to test various modes of operation of the driver device 12 and the intermediate status of the execution of these routines as well as the final status of the test can be displayed on display 20.

Processor 18 controls the simulated motor system 16 in that it causes the simulated motor system 16 to simulate the particular motor on which the driver device 12 operates. To this end, the processor 18 provides control commands or signals to the simulated motor system 16 to cause it to be configured in a desired way (see the arrow in FIG. 1 with the notation "control signals"). Thus, simulated motor system 16 is configurable by processor 18 to simulate different motors depending on which driver device 12 is being tested, i.e., it is a re-configurable electronic apparatus which is configured by the processor 18 to simulate whatever motor the driver device 12 being tested is operative on. In this manner, the same system and assembly of equipment can be used to test different driver devices 12 simply by directing the processor to re-configure the simulated motor system 16.

Simulated motor system 16 represents any one of a variety of different types of motors, including an assembly of multiple motors. For example, motor system 16 can represent a single brushless motor, coupled brushless motors, single-gear motor(s), multiple-geared motor(s), single-phase motor(s) or multi-phase motor(s), as well as combinations of these types of motors.

Load fixtures 14 may comprise one or more resistor/inductor assemblies and one or more current sensors arranged to detect current in the different phases of the simulated motor system 16. The current sensors may be arranged on substrates in a common housing with the resistor/inductor assemblies.

Figure 6:
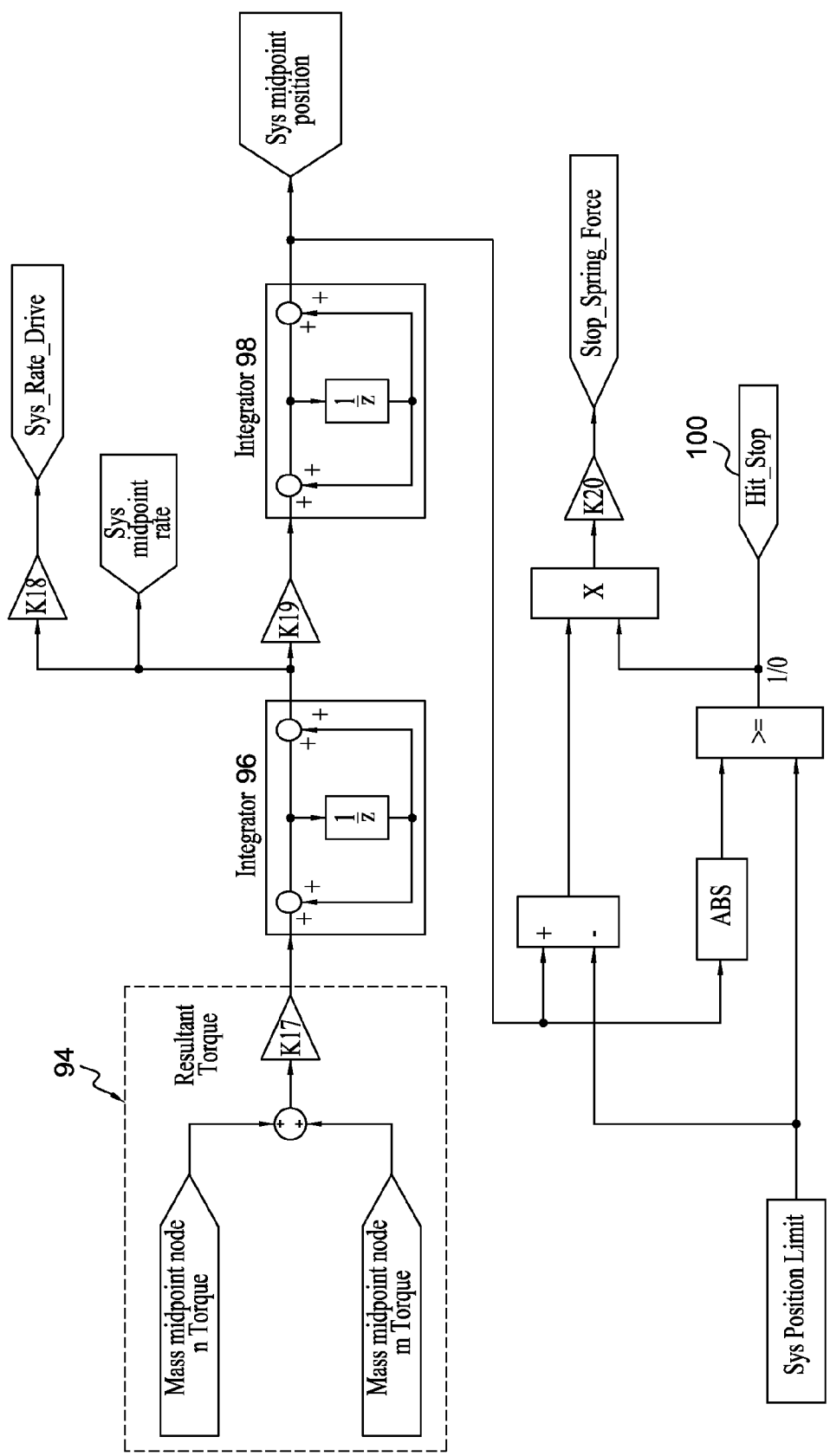
FIG. 6 shows a software model of the shaft midpoint between the two individual motor gear heads of a processor used in the invention.
Figure 7:
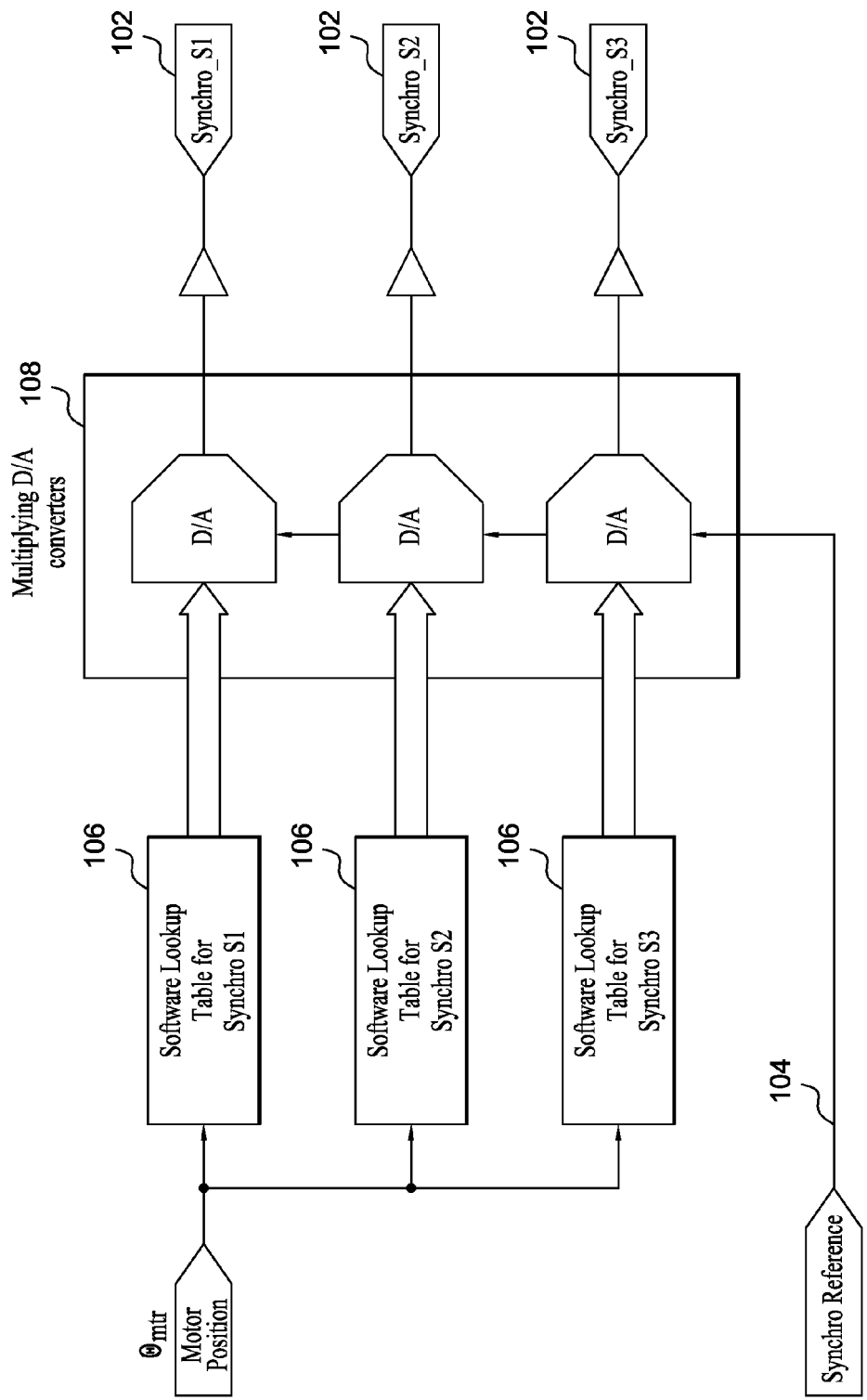
FIG. 7 shows a circuit design used to produce the motor position synchro signals.
Figure 8:
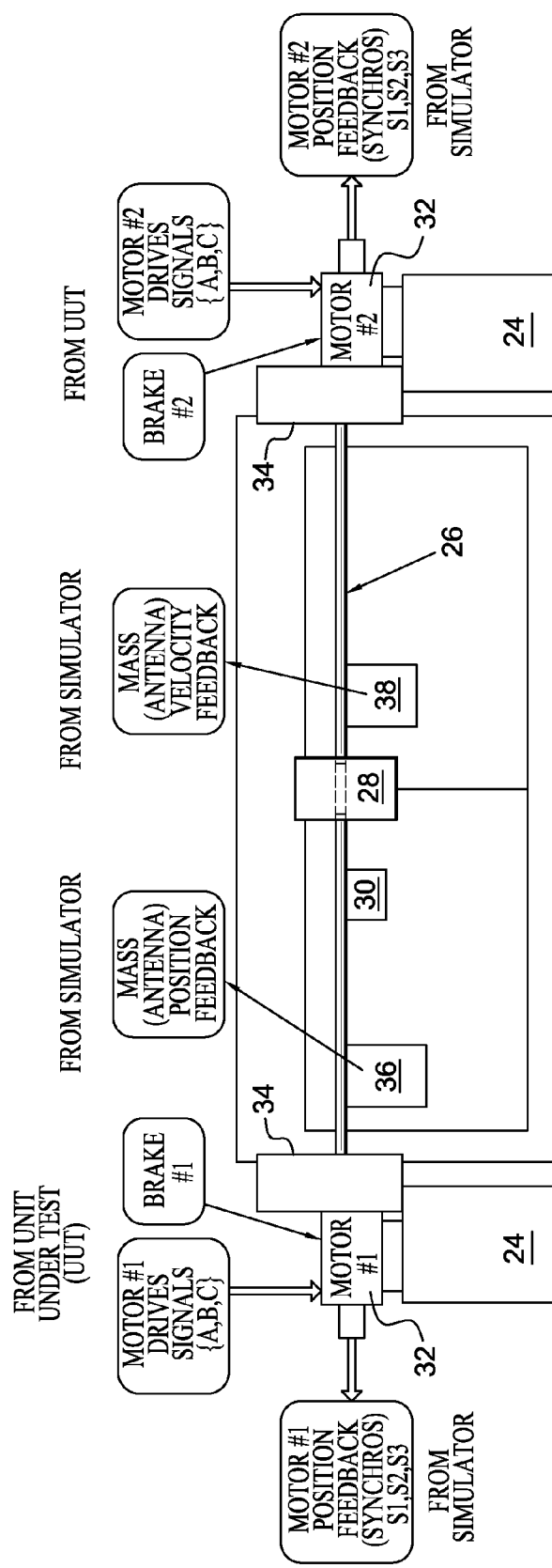
FIG. 8 is a schematic showing an exemplifying motor-driven system, i.e., a motor-driven antenna mass, being simulated.

Referring now to FIGS. 2-9, an exemplifying embodiment of the invention will be described in an application to motors which control rotation of an antenna mass. As shown in FIG. 8, the physical construction of the motor-driven system includes a base structure 22 having a pair of supports 24 on opposite sides of an elongate shaft 26. A flywheel 28 or other heavy mass is arranged on the shaft 26 and one or more mechanical stops 30 are arranged to prevent radial movement of the flywheel 28 beyond design specifications. Mounted on each support 24 is a brushless DC motor 32 connected to a respective end portion of the shaft 26 through a reduction gear system 34. Motors 32 rotate the respective end of the shaft 26 to which they are connected. A position encoder 36 and a velocity feedback transducer 38 are arranged at some position along the shaft 26.

Bearings are preferably arranged at several locations on the antenna mass shaft 26 to support it and allow rotational movement of its ends via the two DC motors 32. The DC motors 32 are multi-phase motors.

FIG. 8 also shows the variables, type of data and the source or recipient of the variables and type of data using a system in accordance with the invention. As discussed more fully below, the motor system being tested provides drive signals and brake signals to the motors 32, the motor system being tested being referred to as the Unit Under Test, abbreviated as UUT. The simulator system 10 receives motor position feedback (synchros) from the motors 32 and a mass (antenna) position feedback from the position encoder 36 as well as a mass (antenna) velocity feedback velocity feedback from transducer 38.

Figure 2:
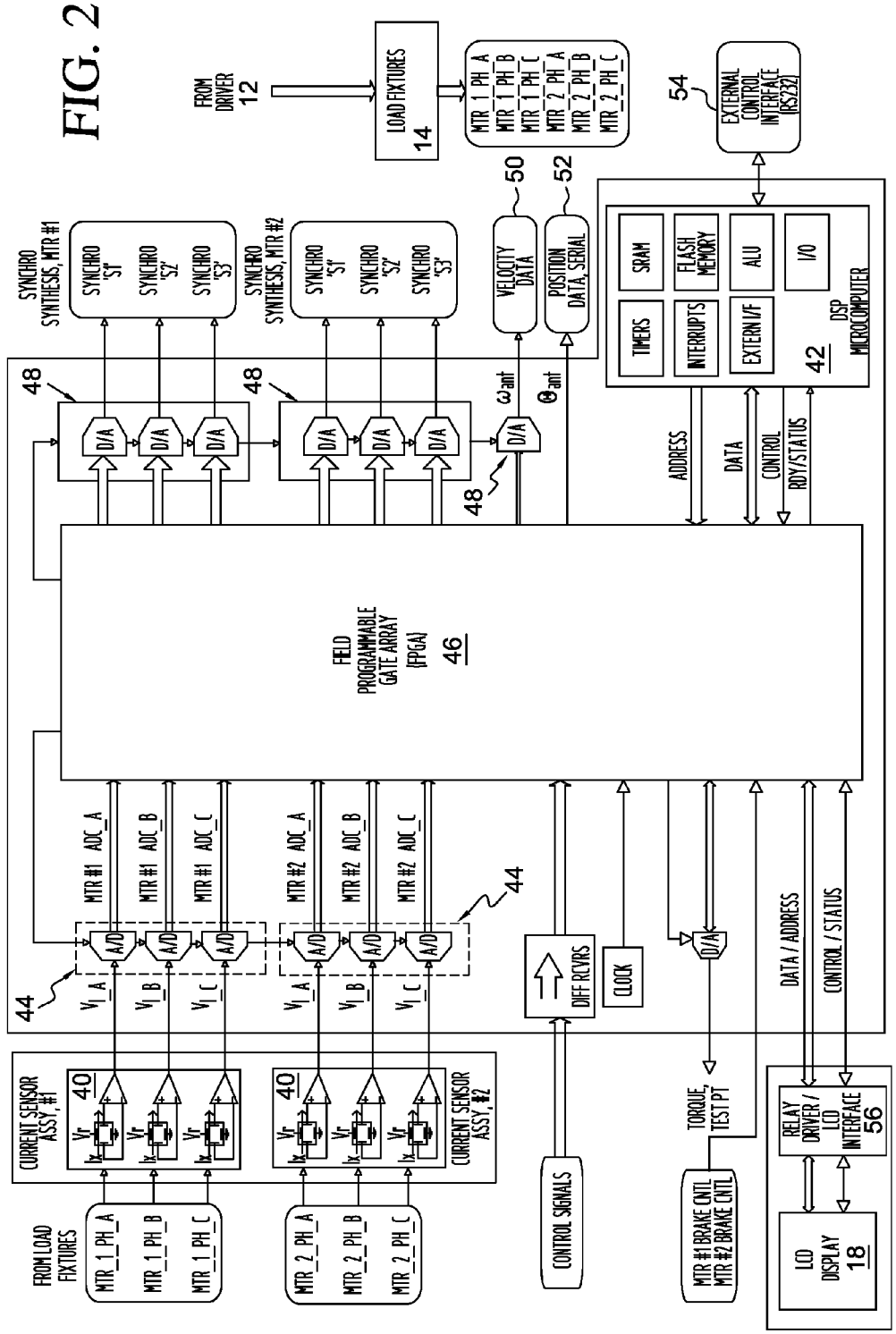
FIG. 2 is a functional block diagram of an exemplifying system in accordance with the invention.

FIG. 2 shows a functional block diagram of an embodiment of the system in accordance with the invention for use with the simulated motor system 16 described immediately above. Driver device 12 directs signals to the load fixtures 14 and currents are generated in each phase A, B and C of each motor 32. Current sensor assemblies 40 include sensors which measure the instantaneous 'motor' current in each phase A, B and C of the motors 32, designated I_A, I_B and I_C. In FIGS. 2-7, the abbreviations MTR_1_PH_A, MTR_1_PH_B and MTR_1_PH_C represent the different phases of the motors 32 and the abbreviations $V_{I\_A}$, $V_{I\_B}$ and $V_{I\_C}$ are voltage representations of the different measured currents of the motors 32. The actual current sensors in current sensor assemblies 40 are preferably constructed to be sensitive, accurate and inherently safe (not electrically connected to the high voltage inverters used in the system).

For simulation of the motor-driven system shown in FIG. 8, the load fixtures 14 preferably comprise two sets of three resistors and three inductors connected in pairs (an RL unit) and all are mounted together on a thermally conductive substrate, such as aluminum, and two current sensor assemblies 40, one for each antenna DC motor 32, arranged on a different substrate. In particular, high power capacity RL loads simulate the actual motor loads. Each current sensor assembly 40 detects currents in the different phases of the simulated motor system 16.

A digital signal processing unit (DSP) 42 is electrically coupled to the current sensor assemblies 40 and includes a set of analog-to-digital converters (ADCs) 44 which convert the current signals measured by the current sensor assemblies 40 into 16 bit digital representations to enable digital processing thereof. DSP 42 also interfaces to a field programmable gate array (FPGA) 46 which is programmed to sample analog current waveforms via the ADCs 44 and pre-process current vector signals in the FPGA 46.

Simulated motor system 16 is represented by mathematical algorithms embedded in the DSP 42. These algorithms thus simulate the operation of the brushless DC motors 32 upon input of the measured currents and determine the angular velocity and position of the antenna mass upon excitation by the motor drivers 12. More specifically, the DSP 42 is programmed to calculate effective motor force (torque) ($T_{mtr}$) from current vector signals ($I_{mtr}$) and stored motor rotational (angular) position ($\theta_{mtr}$). Torque ($T_{mtr}$) is mathematically integrated to obtain motor angular velocity ($\omega_{mtr}$). An angular velocity vector ($\omega_{mtr}$) is mathematically integrated to obtain angular position vector ($\theta_{mtr}$). Angular velocity and position ($\omega_{mtr}$) and ($\theta_{mtr}$) are then used to compute drive shaft angular velocity and position ($\omega_{ant}$) and ($\theta_{ant}$) using a shaft mechanical mass simulation algorithm.

The motor position feedback signals are comprised of synchro signals {S1, S2, S3} for each motor and for each phase thereof are generated by the DSP 42 in conjunction with the digital-to-analog converters 48. The IMU rate data ($\omega_{ant}$) (drive shaft rate-50) is generated via DSP 42 and a digital-to-analog converter 48. The serial antenna position data ($\theta_{ant}$) (position data, serial-52) is generated via FPGA 46. Synchro 'envelopes' and phase relationships are synthesized using a look-up table (LUT) and motor angular position ($\theta_{mtr}$ see FIG. 7). The feedback signals for the IMU rate data and position data are derived from the parameters ($\omega_{ant}$) and ($\theta_{ant}$).

Relay/LCD driver circuit 54 interfaces to the DSP 42 and controls the high power relays used to protect the electrical loads. Driver circuit 56 also converts the native DSP interface to signals useable by the status-monitoring display 20, i.e., the LCD.

DSP 42 is preferably designed to apply an offset value to null the A/D input reading from ADCs 44 to the FPGA 46 and/or the D/A output value from the FPGA 46 to DACs 48. The offset value can be directed to the motor driver 12 during a calibration process.

Other, unidentified components shown in FIG. 2 and their function and cooperation with the components identified above are readily known to those skilled in the art.

Figure 3:
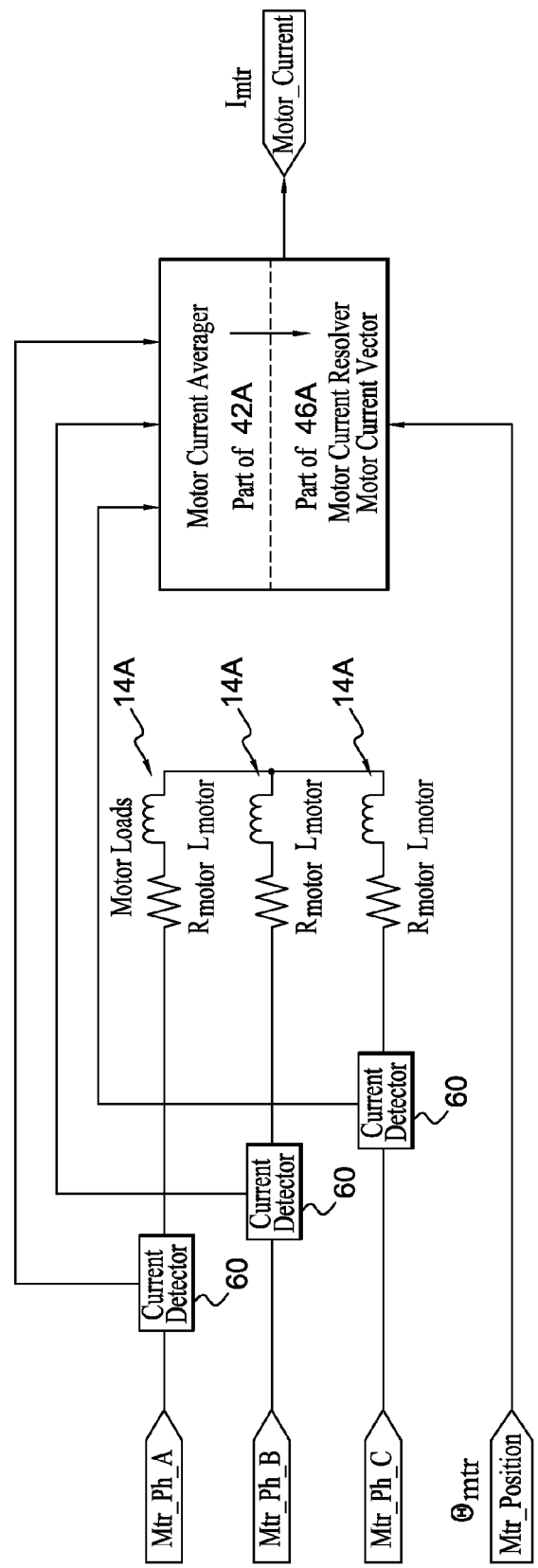
FIG. 3 shows a load and current detection circuitry for use in the invention.

FIG. 3 shows the load and current detection circuitry wherein the RL loads are designated 58 and the current detectors are designated 60. The current in each phase A, B and C is measured by a respective current detector 60. Part 46A of the FPGA 46 is configured as a current averager which generates signed current amplitude, while software part 42A in the DSP 42 resolves the current vector direction (polarity) with respect to the motor position. The current polarity determines the direction of motor torque.

It is pointed out that the circuitry shown in FIG. 3 is for each motor, i.e., there will be two such circuits for the antenna mass motor system shown in FIG. 8. Other, unidentified components shown in FIG. 3 and their function and cooperation with the components identified above are readily known to those skilled in the art.

Figure 4:
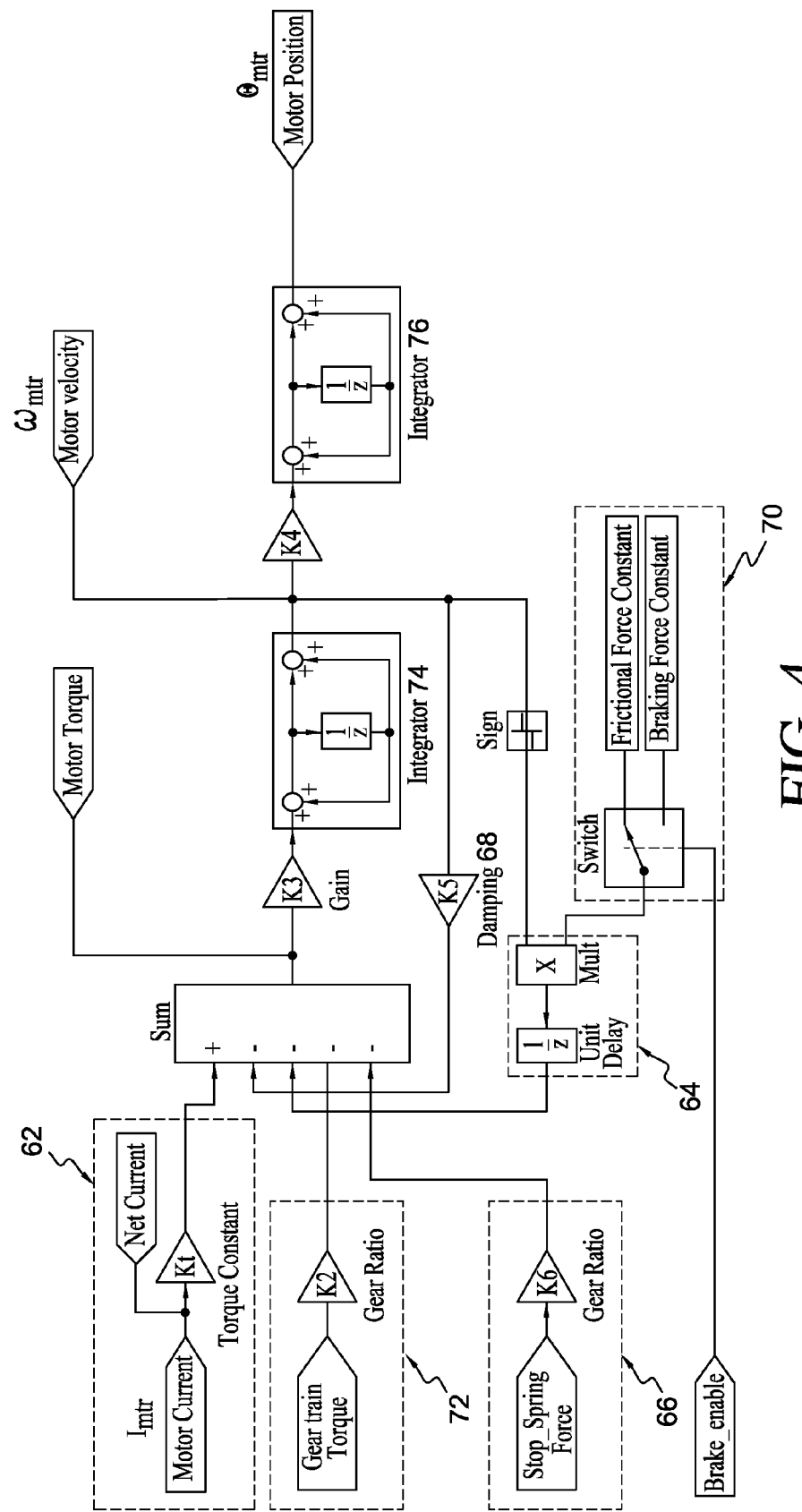
FIG. 4 shows a software model of the individual motors of one embodiment of a processor used in the invention.

The motor current output from the circuitry shown in FIG. 3 is applied to a non-limiting software model of each motors shown in FIG. 4, i.e., two such software models would be provided, one for each motor 32. The software simulation computes input torque from the motor current multiplied by the torque constant (the elements in box 62), subtract out the static frictional force from the applied torque (the elements in box 64), subtract out the spring force that will be present when the antenna mass reaches the end stop (the elements in box 66), subtract out the losses proportional to the motor speed times the damping constant (the elements in box 68) and subtract out braking force when these conditions occur (the elements in box 70). Also included is the reflected force due to the antenna/reduction gear components 72.

The net torque is used to accelerate the motor 32. Acceleration is integrated by integrator 74 to obtain motor speed. Motor speed is integrated by integrator 76 to obtain motor position. Motor position is provided to the current resolver part 26A of the DSP 42 shown in FIG. 3.

The remaining components shown in FIG. 4 and their function and cooperation with the components identified above are readily known to those skilled in the art.

Figure 5:
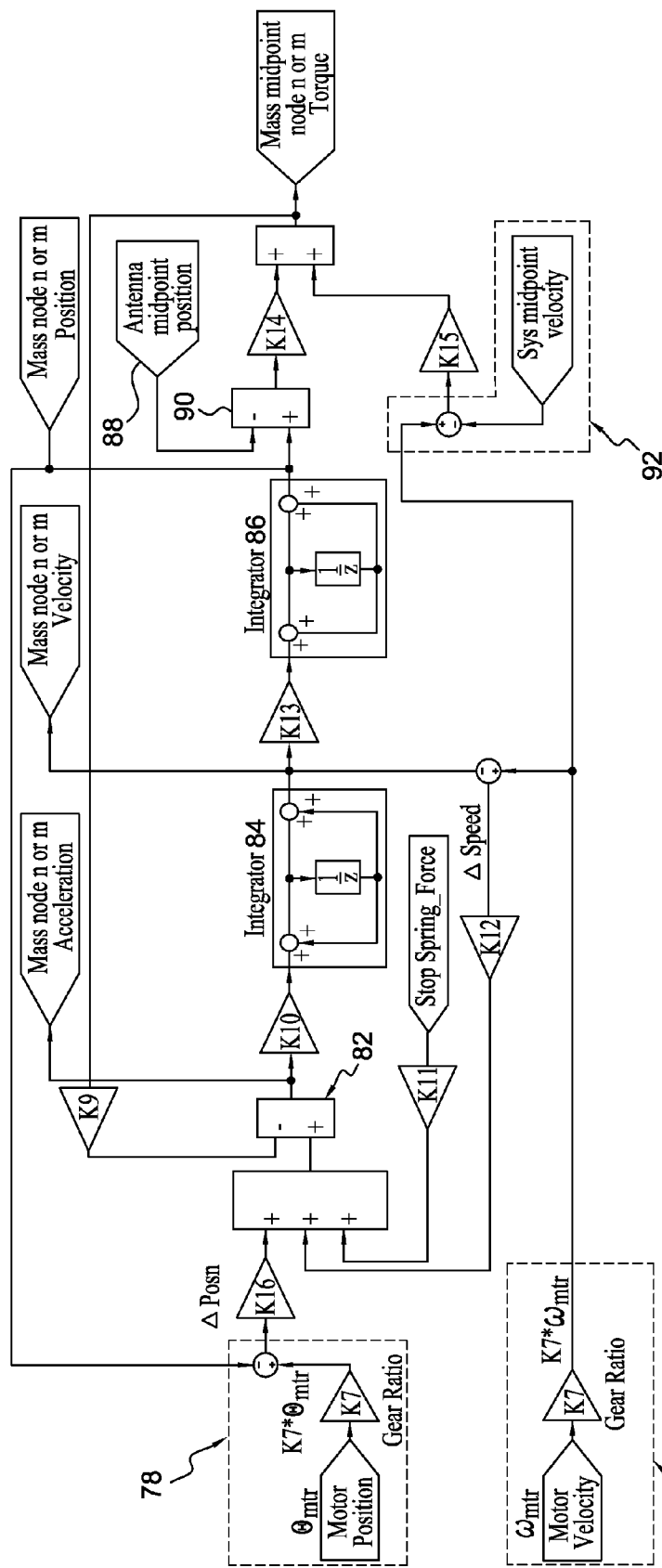
FIG. 5 shows a software model of the individual motor gear heads, that generates the parametric data at the interface of the gear head and the drive shaft of a processor used in the invention.

FIG. 5 shows a non-limiting, exemplifying software model of the individual motor gear heads that computes the parametric data along two nodes (n and m) at the mass drive shaft. This software simulation entails computing the difference between the gear-train (reduction gear) position and the position at node 'n' or 'm' along the antenna drive shaft 78. 'n' or 'm' represent two distinct nodes along the shaft which houses the mass. Also computed is the difference between the gear-train velocity and the velocity at mass node 'n' or 'm' via 80. The mechanical stop spring force is added to the above two signals and subtracting the torque at mass midpoint node of 'n' or 'm' produces the instantaneous acceleration at that node. Mass node 'n' or 'm' velocity is computed by integrating the quantity at 82 via integrator 84. Mass node at position 'n' or 'm' is computed by integrating the mass node 'n' or 'm' velocity via integrator 86. A difference between the mass node 'n' or 'm' position and the "sys midpoint" position (Shaft position 88) is computed at element 90. A difference between the mass node 'n' or 'm' velocity and the "sys midpoint" velocity is computed at element 92. The "sys midpoint" torque is computed by summing the last two differences.

Other, unidentified components shown in FIG. 5 and their function and cooperation with the components identified above are readily known to those skilled in the art.

FIG. 6 shows a non-limiting, exemplifying software model of the shaft midpoint between the two individual motor geartrains. This software simulation entails computing the shaft torque by summing the Motor #1 and Motor #2 mass midpoint torque signals (the elements in 94), computing the shaft midpoint velocity by integrating the mass midpoint torque via integrator 96, and computing the shaft midpoint position by integrating mass midpoint velocity via integrator 98. The "sys midpoint" position is compared to an angular position constant (in radians) to determine if the spring stop has been reached and if so, the program engages the spring force signal and tests the mass midpoint position to determine if the end stop has been reached and if so, it engages the hit-stop signal (the elements in 100).

Other, unidentified components shown in FIG. 6 and their function and cooperation with the components identified above are readily known to those skilled in the art.

FIG. 7 illustrates a circuit design used to produce the motor feedback position synchro signals mentioned above. It is noted that there are two sets of synchro signals 102 used to determine the shaft position of the two drive motors 32 in the example of simulated motor system 16 being used for the purposes of the description of FIGS. 2-8. The reference signal 104 is selected to be a 15 VAC @ 50 KHz Sine wave, but may be any frequency or amplitude compatible with the motor driver device 12 being tested. Synchro 'envelopes' and phase relationships are synthesized using a look-up table (LUT) 106 for each Synchro signal S1, S2, S3 and motor angular position ($\theta_{mtr}$, with the reference signal 104 and phase relationships from the look-up tables 106 being converted from digital form to analog form in DACs 108 to provide the Synchro signals S1, S2, S3. Synchro signals {S1, S2, S3} are thus selected as amplitude modulated signals that use the reference signal as the carrier.

Other, unidentified components shown in FIG. 7 and their function and cooperation with the components identified above are readily known to those skilled in the art.

Figure 9:
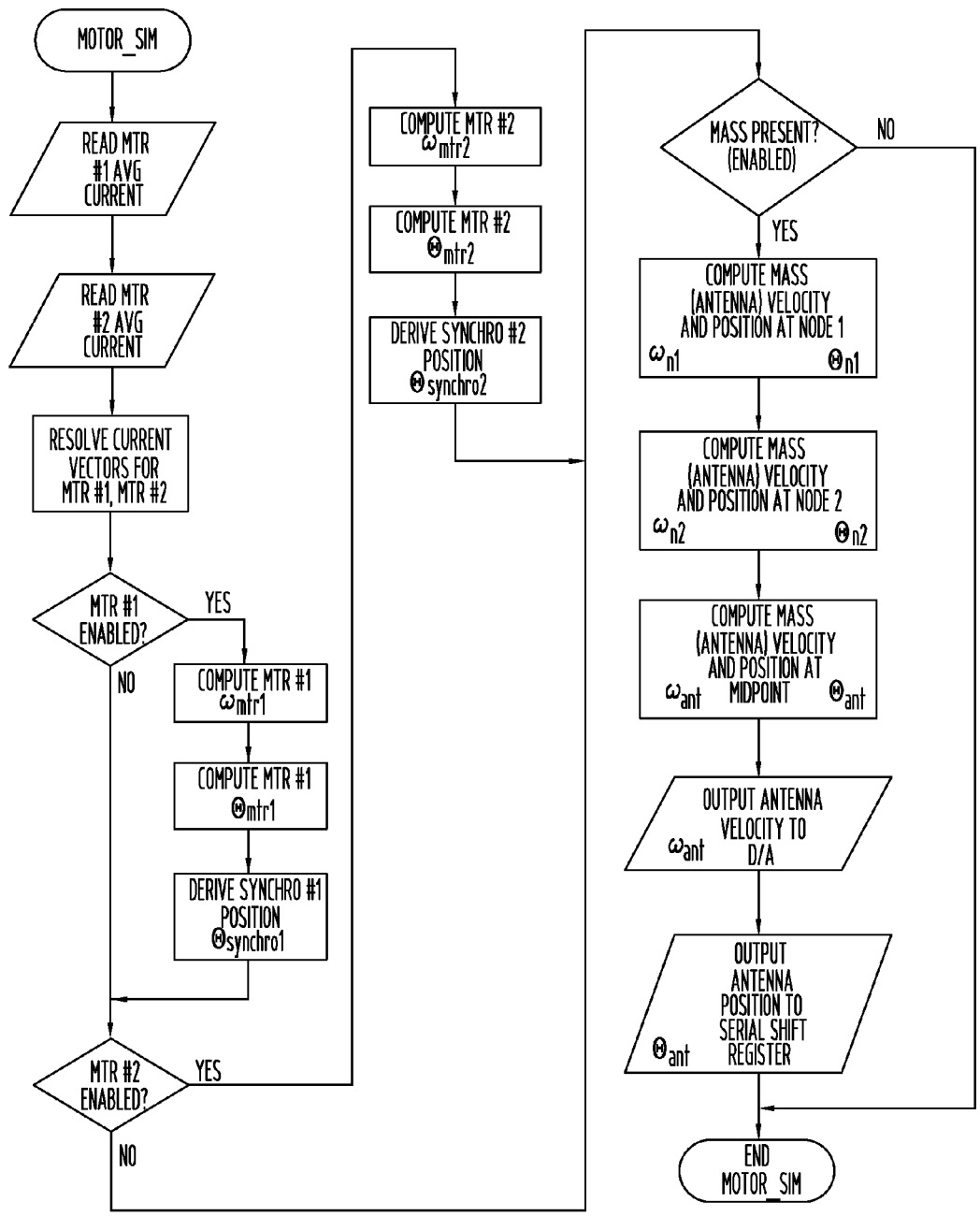
FIG. 9 is a flow chart showing the manner in which a simulation in accordance with the invention is realized.

Referring now to FIG. 9, a simulation in accordance with the invention starts with reading the average currents of the motors 32, and resolving the current vectors therefor. A determination is made whether each motor is enabled and for each enabled motor, the angular position, angular velocity and angular synchro position are computed or otherwise determined. When a mass is deemed to be present, the angular position and velocity of the mass are computed at two nodes and at a midpoint, as described above. The antenna velocity is output to a digital-to-analog converter while the antenna position is output to a serial shift register. The simulation is then complete. Use of the apparatus and method described above is not limited to testing motor drivers for the mechanical system shown in FIG. 8 and can be used to test motor drivers for any types and configuration of motors or motor systems.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

The invention claimed is:

1. An apparatus to electrically simulate, in real-time, a plurality of different electro-mechanical motor systems for testing a motor driver for the motor systems, the motor driver being controlled by a processor, the apparatus comprising:
   at least one electrical load fixture adapted to be coupled to the motor driver, said at least one load fixture being electronically controlled by the motor driver to provide a plurality of different electrical loads;
   said at least one load fixture comprising at least one current detector, each of said at least one current detector being arranged to detect current of a respective drive phase of the motor driver when said at least one load fixture is providing a specific electrical load upon control by the motor driver; and
   a digital signal processing unit that processes current readings from said at least one current detector to generate motor characteristic signals indicative of characteristics of the simulated motor system in the presence of the same current readings when said at least one load fixture is providing the specific load,
   said digital signal processing unit including at least one mathematical algorithm configurable by the processor to simulate different motor systems by receiving control commands or signals from the processor, generating the motor characteristic signals based on the at least one mathematical algorithm after having been configured by said digital signal processing unit to simulate a particular motor system based on the received control commands and signals, and providing the generated motor characteristic signals as feedback signals to the processor representative of the operation of the simulated motor system upon control by the motor driver without construction of the simulated motor system,
   the processor controlling the motor driver and said digital signal processing unit based on the feedback signals.

2. The apparatus of claim 1, wherein said at least one load fixture comprises a plurality of load fixtures, each of said load fixtures including resistive and inductive elements for each drive phase of the motor driver.

3. The apparatus of claim 1, wherein the motor driver is multi-phase, said at least one current detector comprising a plurality of current detectors.

4. The apparatus of claim 1, wherein said digital signal processing unit comprises an analog-to-digital (A/D) converter that converts current information from said at least one current detector into digital format for processing by said digital signal processing unit, and digital-to-analog (D/A) converters that convert the motor characteristic signals into analog signals and into the feedback signals being directed to the processor for use in providing a response to the motor driver for a given excitation provided by the motor driver.

5. The apparatus of claim 4, wherein said digital signal processing unit further comprises a field programmable gate array (FPGA) arranged between said A/D converters and said D/A converters.

6. The apparatus of claim 5, wherein said FPGA is programmed to apply an offset value to null at least one of the A/D input reading to said FPGA and the D/A output value from said FPGA, the offset value being directable to the motor driver during a calibration process.

7. The apparatus of claim 1, wherein the motor characteristic signals include a motor position signal and a motor torque signal in addition to position and velocity of a mass being simulated such that said digital signal processing unit is arranged to derive the motor torque signal from current readings from said at least one current detector and the motor position signal.

8. The apparatus of claim 7, wherein the motor system being simulated includes two brushless direct current (DC) motors coupled to a movable shaft that rotates a mechanical mass and said digital signal processing unit is arranged to derive at least one of motor rotor acceleration, motor rotor velocity, motor rotor position, output shaft acceleration, output shaft velocity and output shaft position signals from the motor torque signal and intrinsic motor parameters selected from a group consisting of inertia, losses, loading and gear-train ratios.

9. The apparatus of claim 1, wherein said digital signal processing unit comprises a field programmable gate array (FPGA).

10. The apparatus of claim 8, further comprising an input system that inputs characteristics to said FPGA to provide said FPGA with calibration offsets for analog-to-digital converters and digital-to-analog converters, and motor characteristic parameters.

11. The apparatus of claim 10, further comprising a storage system that stores a plurality of system offsets, motor characteristic values and characterization data transferred via said input system.

12. The apparatus of claim 10, further comprising a storage system that stores the gate array design implementation data and DSP software algorithms.

13. A method for simulating, in real-time, a plurality of different electro-mechanical motor systems for testing a motor driver for the motor systems, the motor driver being controlled by a processor, the method comprising:
coupling at least one electrical load fixture to the motor driver to be electronically controlled thereby to provide a plurality of different electrical loads;
providing the at least one load fixture with at least one current detector, each current detector being arranged to detect current of a respective drive phase of the motor driver when the at least one load fixture is providing a specific electrical load upon control by the motor driver;
configuring at least one mathematical algorithm in a digital signal processing unit by means of the processor to simulate the motor system by receiving control commands or signals from the processor; directing current readings from the at least one current detector to the digital signal processing unit which generate motor characteristic signals indicative of characteristics of the simulated motor system in the presence of the same current readings when said at least one load fixture is providing the specific load, the motor characteristic signals being generated based on the at least one mathematical algorithm after having been configured by the processor to simulate a particular motor system based on the received control commands and signals without construction of the simulated motor system; and
directing the motor characteristic signals as feedback signals to the processor representative of the operation of the simulated motor system upon control by the motor driver to ascertain the functionality of the motor driver such that the processor controls the motor driver and the digital signal processing unit based on the feedback signals.

14. The method of claim 13, further comprising selectively configuring the digital signal processing unit to simulate different motor systems.

15. The method of claim 14, further comprising adjusting motor parameters to enable the simulation of the different motor systems, the motor parameters being inertia, losses, loading and gear-train ratios.

16. The method of claim 13, wherein the motor system being simulated includes two brushless direct current (DC) motors coupled to a movable shaft that rotates a mechanical mass, the at least one mathematical algorithm in the digital signal processing unit being configured by means of the processor to simulate the motor system by receiving control commands or signals from the processor thereby, modifying a transfer function of the simulator and mass combination.

17. The method of claim 13, further comprising adjusting the motor driver based on the feedback signals.

18. The method of claim 13, further comprising converting the current readings from the at least one current detector into digital form for processing by a field programmable gate array in the digital signal processing unit.

19. The method of claim 18, further comprising representing the simulated motor system by a plurality of mathematical algorithms embedded in the digital signal processing unit.

20. The method of claim 19, further comprising designing the algorithms to derive angular velocity and position of an antenna mass upon excitation by the motor drivers based on input of the detected current readings and stored motor rotational position.

* * * * *